United States Patent
Han et al.

(10) Patent No.: US 10,453,413 B2
(45) Date of Patent: Oct. 22, 2019

(54) ARRAY SUBSTRATE AND DRIVING METHOD, DRIVING CIRCUIT, AND DISPLAY APPARATUS

(71) Applicant: BOE TECHNOLOGY GROUP CO., LTD., Beijing (CN)

(72) Inventors: Seungwoo Han, Beijing (CN); Guangliang Shang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 76 days.

(21) Appl. No.: 15/565,756

(22) PCT Filed: Mar. 29, 2017

(86) PCT No.: PCT/CN2017/078560
§ 371 (c)(1),
(2) Date: Oct. 11, 2017

(87) PCT Pub. No.: WO2018/072396
PCT Pub. Date: Apr. 26, 2018

(65) Prior Publication Data
US 2018/0315388 A1    Nov. 1, 2018

(51) Int. Cl.
*G09G 3/36* (2006.01)
*G09G 3/20* (2006.01)
(Continued)

(52) U.S. Cl.
CPC ............. *G09G 3/3677* (2013.01); *G09G 3/20* (2013.01); *G09G 3/3225* (2013.01); *G09G 3/36* (2013.01);
(Continued)

(58) Field of Classification Search
CPC .. G09G 3/3677; G09G 3/3688; G09G 3/3648; G09G 3/20; G09G 3/3225;
(Continued)

(56) References Cited

U.S. PATENT DOCUMENTS

| | | | | |
|---|---|---|---|---|
| 10,013,916 B2 * | 7/2018 | Nonaka | | G09G 3/3233 |
| 2004/0056828 A1 * | 3/2004 | Choi | | G09G 3/3233 |
| | | | | 345/82 |

(Continued)

FOREIGN PATENT DOCUMENTS

| | | |
|---|---|---|
| CN | 1632853 A | 6/2005 |
| CN | 1808535 A | 7/2006 |

(Continued)

OTHER PUBLICATIONS

International Search Report & Written Opinion dated Jul. 24, 2017, regarding PCT/CN2017/078560.
(Continued)

*Primary Examiner* — Ibrahim A Khan
(74) *Attorney, Agent, or Firm* — Intellectual Valley Law, P.C.

(57) ABSTRACT

The present application discloses an array substrate comprising a plurality of gate lines and a plurality of data lines crossing over each other thereby defining an array of a plurality of sub-pixel areas, each sub-pixel area comprising a pixel electrode and multiple switching transistors having respective gate electrodes coupled to multiple different gate lines, wherein the pixel electrode is configured to be charged by a data signal from a data line only with all the multiple switching transistors being turned on concurrently during a pixel electrode charging period by an effective voltage level applied on the respective multiple different gate lines.

7 Claims, 3 Drawing Sheets

(51) Int. Cl.
  *G09G 3/3225* (2016.01)
  *H01L 27/12* (2006.01)
  *H01L 29/786* (2006.01)
  *G02F 1/1362* (2006.01)
  *G02F 1/1368* (2006.01)

(52) U.S. Cl.
  CPC ......... *G09G 3/3648* (2013.01); *G09G 3/3688* (2013.01); *H01L 27/124* (2013.01); *H01L 27/1225* (2013.01); *H01L 29/7869* (2013.01); *G02F 1/1368* (2013.01); *G02F 1/13624* (2013.01); *G02F 2202/10* (2013.01); *G09G 2300/0404* (2013.01); *G09G 2300/0426* (2013.01); *G09G 2300/0819* (2013.01); *G09G 2310/021* (2013.01); *G09G 2310/0205* (2013.01); *G09G 2320/043* (2013.01); *G09G 2320/045* (2013.01)

(58) Field of Classification Search
  CPC ............ G09G 3/36; G09G 2300/0426; G09G 2300/0819; G09G 2310/021; G09G 2320/045; G09G 2310/0205; G09G 2300/0404; G09G 2320/043; H01L 27/124; H01L 27/1225; H01L 29/7869; G02F 1/1368; G02F 1/13624; G02F 2202/10
  See application file for complete search history.

(56) References Cited

U.S. PATENT DOCUMENTS

| | | | |
|---|---|---|---|
| 2004/0108987 A1 | 6/2004 | Park et al. | |
| 2006/0125408 A1* | 6/2006 | Nathan | G09G 3/3233 315/169.3 |
| 2006/0170641 A1* | 8/2006 | Song | G09G 3/3696 345/98 |
| 2006/0220991 A1* | 10/2006 | Lee | G02F 1/13452 345/52 |
| 2007/0018940 A1* | 1/2007 | Park | G09G 3/3677 345/100 |
| 2010/0002163 A1 | 1/2010 | Sekine | |
| 2010/0039458 A1* | 2/2010 | Nathan | G09G 3/3233 345/698 |
| 2013/0027326 A1* | 1/2013 | Kim | G06F 3/0412 345/173 |
| 2014/0084805 A1* | 3/2014 | Kim | G09G 3/2048 315/228 |
| 2015/0243203 A1* | 8/2015 | Kim | G09G 3/2092 345/212 |
| 2015/0243220 A1* | 8/2015 | Kim | H01L 27/1225 345/215 |
| 2017/0329189 A1* | 11/2017 | Kim | G02F 1/13454 |
| 2018/0204889 A1* | 7/2018 | Yu | G09G 3/3233 |

FOREIGN PATENT DOCUMENTS

| | | |
|---|---|---|
| CN | 101191968 A | 6/2008 |
| CN | 101344691 A | 1/2009 |
| CN | 101364387 A | 2/2009 |
| CN | 101620333 A | 1/2010 |
| CN | 101620353 A | 1/2010 |

OTHER PUBLICATIONS

First Office Action in the Chinese Patent Application No. 201610906144.2, dated Mar. 8, 2019; English translation attached.

Second Office Action in the Chinese Patent Application No. 201610906144.2, dated Apr. 22, 2019; English translation attached.

* cited by examiner

ARRAY SUBSTRATE AND DRIVING METHOD, DRIVING CIRCUIT, AND DISPLAY APPARATUS

CROSS-REFERENCE TO RELATED APPLICATION

This application is a national stage application under 35 U.S.C. § 371 of International Application No. PCT/CN2017/078560, filed Mar. 29, 2017, which claims priority to Chinese Patent Application No. 201610906144.2, filed Oct. 18, 2016, the contents of which are incorporated by reference in the entirety.

TECHNICAL FIELD

The present invention relates to display technology, particularly to an array substrate and driving method thereof, a driving circuit and a display apparatus.

BACKGROUND

Recently, the development of display technology leads to advance of thin-film transistors for driving and controlling pixel circuits. In particular, amorphous silicon thin film transistor and low-temperature poly-silicon thin-film transistor have been replaced by metal oxide thin-film transistor. The metal oxide thin-film transistor has many functional advantages in high electron mobility, low open-state current, and fast switching characteristics. Manufacture of the metal oxide thin-film transistors are also advantageous in less characteristic non-uniformity, low cost in material and process, low process temperature, capable of using coating process to form the thin-film transistor with high transmittance rate and large band gap. As a result, the metal oxide thin-film transistor has been used in many display applications that need fast response time and large current, such as high-frequency response, high resolution, large-size liquid crystal display and organic light emitting display.

The state-of-art metal oxide thin-film transistor, however, is not stable in performance. When the gate of the metal oxide thin-film transistor is under a low voltage level for relatively long time, the metal oxide thin-film transistor will suffer a negative bias stress, leading to a negative shift of transistor threshold voltage level. As a result, various abnormal display phenomena occur in the images displayed by the display apparatus based on the metal oxide thin-film transistors.

SUMMARY

In one aspect, the present invention provides an array substrate comprising a plurality of gate lines and a plurality of data lines crossing over each other thereby defining an array of a plurality of sub-pixel areas, each sub-pixel area comprising a pixel electrode and multiple switching transistors, a gate electrode of each of the multiple switching transistors coupled to one of multiple different gate lines; wherein the pixel electrode is configured to be charged by a data signal from a data line only with all the multiple switching transistors being turned on concurrently during a pixel electrode charging period by an effective voltage level applied respectively on the multiple different gate lines.

Optionally, the multiple switching transistors in each sub-pixel area comprises a first switching transistor and a second switching transistor, wherein the first switching transistor includes a gate electrode connected to a first gate line of the plurality of gate lines and the second switching transistor includes a gate electrode connected to a second gate line of the plurality of gate lines.

Optionally, the first gate line and the second gate line are two adjacent gate lines among the plurality of gate lines.

Optionally, the first switching transistor includes a source electrode connected to the data line and a drain electrode connected to a source electrode of the second switching transistor, the second switching transistor includes a drain electrode connected to the pixel electrode.

Optionally, each sub-pixel area comprises at least one switching transistor having a gate electrode connected to a same gate line connected to at least another switching transistor associated with an adjacent sub-pixel area along the same data line.

Optionally, each gate line is configured to be loaded with a gate scanning signal at a first voltage level equal to the effective voltage level sufficient for turning on any switching transistor having a gate electrode connected to the each gate line.

Optionally, at least one of the first gate line and the second gate line are configured to be respectively loaded with a gate scanning signal at a second voltage level for turning off at least one of the first switching transistor and the second switching transistor to stop charging the data signal to the pixel electrode outside the pixel electrode charging period.

Optionally, each of the multiple switching transistors is a metal oxide thin-film transistor.

In another aspect, the present invention provides a display apparatus comprising an array substrate coupled to a gate driving circuit and a data driving circuit, the array substrate comprising a plurality of gate lines and a plurality of data lines crossing over each other thereby defining an array of a plurality of sub-pixel areas, each sub-pixel area comprising a pixel electrode and multiple switching transistors having respective gate electrodes coupled to multiple different gate lines, wherein the pixel electrode is configured to be charged by a data signal from a data line only with all the multiple switching transistors being turned on concurrently during a pixel electrode charging period by an effective voltage level applied respectively on the multiple different gate lines; the gate driving circuit comprising a first signal generator configured to generate and load a first voltage level to each of the multiple different gate lines to turn on each of multiple switching transistors concurrently during the pixel electrode charging period; the data driving circuit comprising a second signal generator configured to generate and input the data signal to the data line; wherein the a first signal generator is configured to load a second voltage signal to at least one of the multiple different gate lines to turn off at least one of the multiple switching transistors outside the pixel electrode charging period.

In another aspect, the present invention provides a method for driving the array substrate comprising a plurality of gate lines and a plurality of data lines crossing over each other thereby defining an array of a plurality of sub-pixel areas, each sub-pixel area comprising a pixel electrode and multiple switching transistors having respective gate electrodes coupled to multiple different gate lines, wherein the pixel electrode is configured to be charged by a data signal from a data line only with all the multiple switching transistors being turned on concurrently during a pixel electrode charging period by an effective voltage level applied respectively on the multiple different gate lines, the method comprising loading a first voltage level equal to or above the effective voltage level to each of the multiple different gate lines respectively connected to respective gate electrodes of the multiple switching transistors in the each sub-pixel area to turn on each of the multiple switching transistors independently, wherein each of the multiple switching transistors is in an ON-state during the pixel electrode charging period for inputting a data signal to the pixel electrode; and loading a second voltage level to at least one of the multiple different gate lines to turn at least one of the multiple switching transistors in the each sub-pixel area to an OFF-state prior to and subsequent to the pixel electrode charging period.

Optionally, the array substrate comprises a first gate line and a second gate line being two adjacent gate lines among the plurality of gate lines and comprises a first switching transistor and a second switching transistor coupled in series in each sub-pixel area, the first gate line being connected to a gate of the first switching transistor and the second gate line being connected to a gate of the second switching transistor, the method comprising loading the first voltage level to the first gate line and the second gate line nrspectively and concurrently during the pixel electrode charging period to turn on the first switching transistor and the second switching transistor such that both the first switching transistor and the second switching transistor are in an ON-state; and loading the second voltage level to at least one of the first gate line and the second gate line prior to and subsequent to the pixel electrode charging period to turn the at least one of the first switching transistor and the second switching transistor to an OFF-state.

Optionally, the first switching transistor includes a source electrode connected to the data line and a drain electrode connected to a source electrode of the second switching transistor, the second switching transistor includes a drain electrode connected to the pixel electrode.

Optionally, either one of the first gate line and the second gate line is a gate line commonly connected to two respective gates of two switching transistors respectively in two sub-pixel areas adjacent to each other along the same data line.

Optionally, a ratio of a first time interval in ON-state over a second time interval in OFF-state for each of the first switching transistor and the second switching transistor is set to be between proximately 0.1 and proximately 10.

Optionally, the array substrate comprises a total of K gate lines, K is an integer, the first gate line is an odd-numbered gate line and the second gate line is a next even-numbered gate line adjacent to the odd-numbered gate line, the method comprising in a first time period, loading a first gate scanning signal to each odd-numbered gate line of the K gate lines and a second gate scanning signal to each even-numbered gate line of the K gate lines, the first gate scanning signal being provided with the first voltage level for a first duration and subsequently provided with the second voltage level after the first duration, the second gate scanning signal being provided with the first voltage level for a second duration and subsequently provided with the second voltage level after the second duration maintained at the second voltage level until the first time period ends, wherein the second duration starts after the first duration and partially overlaps with the first duration; wherein the first gate scanning signal loaded to any odd-numbered gate line is provided with the first voltage level again starting from another time point after the second gate scanning signal loaded to a next even-numbered gate line adjacent to the any odd-numbered gate line is provided with the second voltage level until the first time period ends; and in a second time period, loading the first gate scanning signal to each odd-numbered gate line of the K gate lines and the second gate scanning signal to each even-numbered gate line of the K gate lines, the first gate scanning signal being provided with the first voltage level for a first duration and subsequently provided with the second voltage level after the first duration and maintained at the second voltage level until the second time period ends, the second gate scanning signal being provided with the first voltage level for a second duration and subsequently provided with the second voltage level after the second duration, wherein the second duration starts after the first duration and partially overlaps with the first duration; wherein the second gate scanning signal loaded to any even-numbered gate line is provided with the first voltage level again starting from another time point after the first gate scanning signal loaded to a next odd-numbered gate line adjacent to the any even-numbered gate line is provided with the second voltage level until the second time period ends.

Optionally, the first time period is a time period of displaying a frame of image through the total K gate lines of the array substrate, the second time period is another time period of displaying a frame of image through the same total K gate lines of the same array substrate, the second time period is separated from the first time period by an time interval equal to N numbers of time periods of displaying a frame of image, wherein N equal to 0 or a positive integer.

Optionally, the first time period and the second time period are provided alternatively.

Optionally, within each of the N>0 numbers of time periods, the first gate scanning signal is provided with the first voltage level for a first duration and subsequently provided with the second voltage level after the first duration and maintained at the second voltage level until the each of the N>0 numbers of time periods ends, the second gate scanning signal is provided with the first voltage level for a second duration and subsequently provided with the second voltage level after the second duration maintained at the second voltage level until the each of the N>0 numbers of time periods ends.

In another aspect, the present invention provides a driving circuit configured to drive an array substrate described herein, the driving circuit comprising a gate driving circuit configured to load a first voltage level to each of the multiple different gate lines respectively connected to respective gate electrodes of the multiple switching transistors in the each sub-pixel area to turn on each of the multiple switching transistors independently, wherein each of the multiple switching transistors is in an ON-state during the pixel electrode charging period for inputting a data signal to the pixel electrode, and to load a second voltage level to at least one of the multiple different gate lines to turn at least one of the multiple switching transistors in the each sub-pixel area to an OFF-state prior to and subsequent to the pixel electrode charging period.

In another aspect, the present invention provides a display apparatus comprising an array substrate described herein and a driving circuit described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
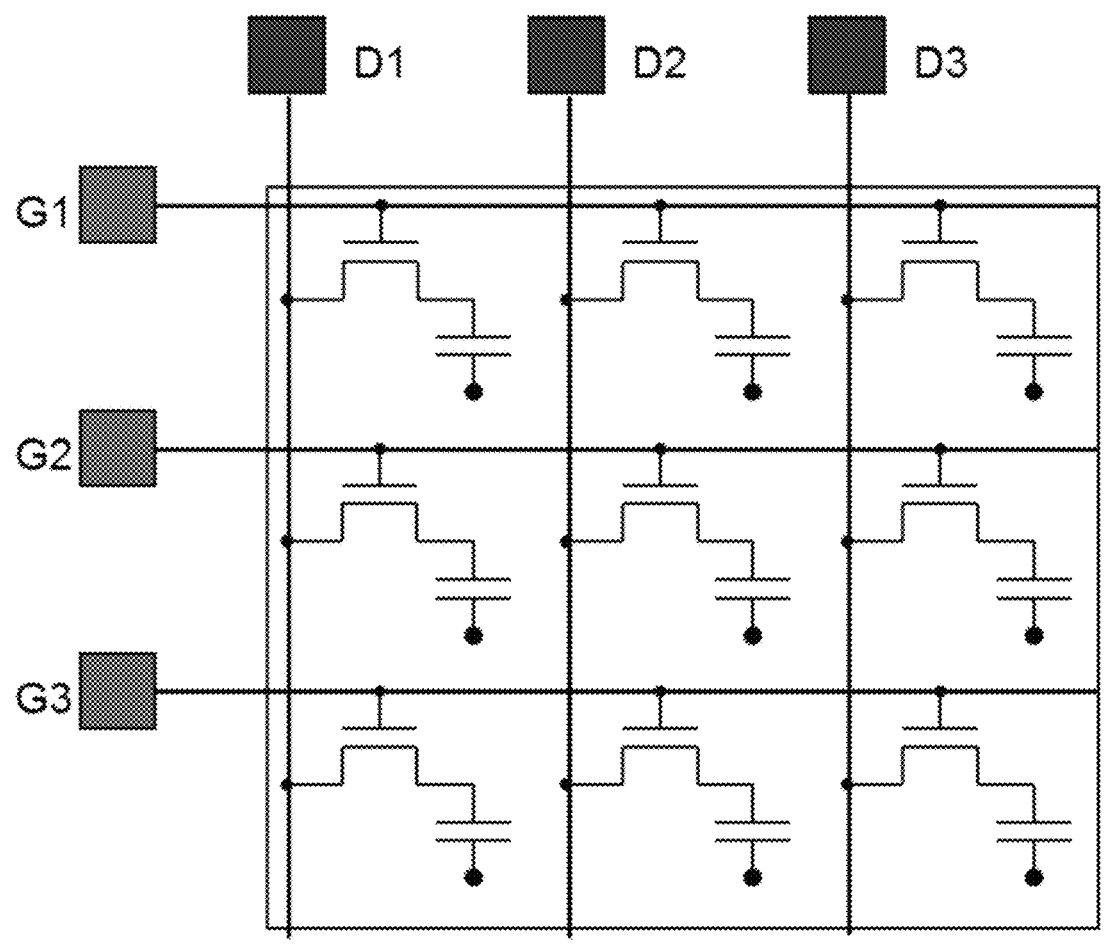
FIG. 1 is a structural diagram of a conventional array substrate.

In a conventional array substrate based on thin-film transistors, as shown in FIG. 1, the array substrate includes a plurality of gate lines crossing over a plurality of data lines, thereby defining an array of a plurality of sub-pixel areas. Each sub-pixel area is configured with only one switching transistor for forming a connection between a pixel electrode and a data line. For example, the switching transistor is a metal oxide thin-film transistor. Functionally, the switching transistor, within a time period of displaying a frame of image, includes a gate electrode for receiving a gate scanning signal provided with a relatively high potential level to turn on the switching transistor so that the connection between the pixel electrode and the data line is on to allow inputting a data signal for charging the pixel electrode. After the high potential level is off, the gate electrode usually will be coupled to a low potential level to turn off the switching transistor so that the connection between the pixel electrode and the data line is off and the charging period of the pixel electrode is over. During a series of display time periods, the gate electrode of the metal oxide thin-film transistor is under a low potential level for relatively long time. Thus, the metal oxide thin-film transistor will suffer a prolonged negative bias stress, leading to a negative shift of transistor threshold voltage level.

Accordingly, the present disclosure provides, inter alia, an array substrate, a method for driving the array substrate, a driving circuit, and a display apparatus that substantially obviate one or more of the problems due to limitations and disadvantages of the related art. In one aspect, the present disclosure provides a thin-film-transistor-based array substrate for solving the image abnormality issue and enhancing display effect of a liquid crystal display apparatus based on the array substrate.

Figure 2:
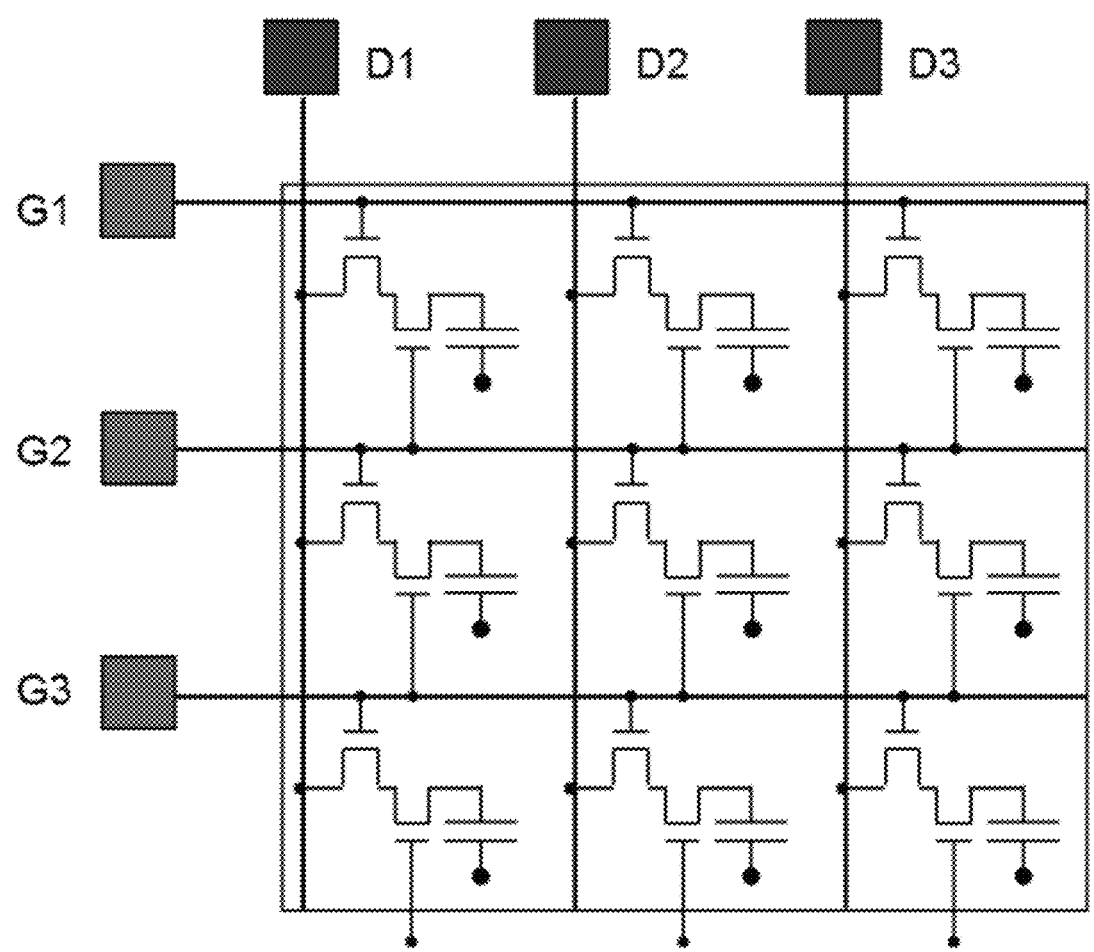
FIG. 2 is a structural diagram of an array substrate according to some embodiments of the present disclosure.

FIG. 2 is a structural diagram of an array substrate according to some embodiments of the present disclosure. The array substrate includes a plurality of gate lines crossing over a plurality of data lines, defining an array of a plurality of sub-pixel areas in between. Each sub-pixel area is configured with multiple switching transistors and a pixel electrode. In particular, the multiple switching transistors are coupled in series to build a connection between the pixel electrode and a data line for each sub-pixel area. The multiple switching transistors have respective gate electrodes connected to multiple different gate lines of the plurality of gate lines. All the multiple switching transistors are involved to control the connection between the pixel electrode and the data line so that a data signal can be transmitted from the data line to the pixel electrode for displaying a sub-pixel of an image. As each gate electrode of each switching transistor is connected to a different gate line, each switching transistor can be turned on by independently loading a gate scanning signal provided with an effective voltage level. Optionally, the effective voltage level is a high voltage signal with a specific value depended on transistor intrinsic threshold voltage level and bias condition. Accordingly, the same switching transistor can be turned off by a low voltage signal. As the multiple switching transistors are coupled in series, all the multiple switching transistors must be in an ON-state concurrently during a time interval to make the connection in an ON-state to allow the pixel electrode being charged by the data signal during this time interval. Outside this time interval, the data signal will not be transmitted to the pixel electrode if at least one switching transistor is turned off by the low voltage signal. Optionally, the switching transistor is a thin-film transistor. In particular, the switching transistor is a metal-oxide thin-film transistor.

In some embodiments, each sub-pixel area is configured with multiple switching transistors having respective gates connected to multiple different gate lines respectively. When all the multiple switching transistors are in an ON-state, the pixel electrode in the sub-pixel area is able to be charged by a data signal (a voltage signal) in a pixel electrode charging period. When any one or more of the multiple switching transistors are in an OFF-state, the pixel electrode in the sub-pixel area is not able to be charged and is outside the pixel electrode charging period. Thus, during an operation of driving the array substrate outside the pixel electrode charging period, it is optional to have any one of the multiple switching transistors within the sub-pixel area to be kept in an ON-state as long as not all switching transistors are in an ON-state. In other words, it is possible to properly and relatively flexibly adjust various gate scanning signals so that during a first time interval any switching transistor is in an ON-state and during a second time interval the same switching transistor is in an OFF-state during any time period of displaying a frame of image without affecting the pixel electrode in the sub-pixel area being charged for normal image display. Particularly, as a ratio of the first time interval with the switching transistor in ON-state and the second time interval with the switching transistor in OFF-state can be set to within an optimum range. By this setting, the durations of keeping the switching transistor under a negative bias or under a positive bias is balanced to reduce bias stress so that the threshold voltage of the switching transistor can be kept substantially free of shifting. Therefore, the present disclosure provides a solution for the problem of image abnormality and enhances image quality of the thin-film-transistor-based display apparatus.

In a specific embodiment, referring to FIG. 2, each sub-pixel area includes a first switching transistor and a second switching transistor. The first switching transistor includes a gate electrode connected to a first gate line of the plurality of gate lines. The second switching transistor includes a gate electrode connected to a second gate line of the plurality of gate lines. When both the first switching transistor and the second switching transistor are in an ON-state at the same time, the pixel electrode in the sub-pixel area is able to be charged by a data signal.

Referring to FIG. 2 again, in a specific embodiment, the first gate line is adjacent to the second gate line.

Additionally, the first switching transistor includes a source electrode connected to a data line associated with the sub-pixel area and a drain electrode connected to a source electrode of the second switching transistor. The second switching transistor includes a drain electrode connected to the pixel electrode associated with the sub-pixel area.

Referring to FIG. 2 again, the array substrate includes multiple gate lines G1, G2, G3, G4 and multiple data lines D1, D2, and D3. Each sub-pixel area includes a pixel electrode and two switching transistors, i.e., the first switching transistor and the second switching transistor. A gate electrode of the first switching transistor is connected to the first gate line G1. A gate electrode of the second switching transistor is connected to the second gate line G2. G1 and G2 are two adjacent gate lines. The first switching transistor and the second switching transistor in each sub-pixel area is coupled in series to form a connection between the pixel electrode of the sub-pixel area and a data line passing through the sub-pixel area. A source electrode of the first switching transistor is connected to a data line associated with the sub-pixel area. A drain electrode of the first switching transistor is connected to a source electrode of the second switching transistor. A drain electrode of the second switching transistor is connected to a pixel electrode in the sub-pixel area.

Referring to FIG. 2, each sub-pixel area comprises at least one switching transistor having a gate electrode connected to a same gate line connected to at least another switching transistor associated with an adjacent sub-pixel area along the same data line. For example, along a data line D1, a first sub-pixel area includes a second switching transistor having its gate electrode connected to G2 gate line, a second sub-pixel area that is adjacent to the first sub-pixel area includes a first switching transistor having a gate electrode connected to the same G2 gate line.

When both the first switching transistor and the second switching transistor of each sub-pixel area are turned on, the pixel electrode in the sub-pixel area is being charged or in a pixel electrode charging period. Outside, prior or after, the pixel electrode charging period, at least one of the first switching transistor and the second switching transistor can be reset to an ON-state to make both of them not stayed in an OFF-state for too long. Thus, the time for the switching transistor to be under negative bias stress or remain in positive bias can be controlled and balanced so that the transistor threshold voltage level is substantially free of shifting due to the long-time negative bias stress. Therefore, the display abnormity issue can be avoided and the image quality can be enhanced.

In another aspect, the present disclosure provides a method for driving the array substrate mentioned above, for example, as shown in FIG. 2. The method includes loading each of multiple gate scanning signals provided with a first voltage level (i.e., a high voltage signal) to each of the multiple gate lines respectively connected to multiple switching transistors associated with each sub-pixel area to respectively and timely turn on each of the multiple switching transistors, wherein each of the multiple switching transistors is in an ON-state concurrently during a pixel electrode charging period for inputting a data signal from a data line to the pixel electrode in the sub-pixel area. Then the method includes loading a second voltage level to at least one of the multiple different gate lines to turn at least one of the multiple switching transistors in the each sub-pixel area to an OFF-state prior to and subsequent to the pixel electrode charging period. Optionally, loading the second voltage level (e.g., a low voltage signal) is to stop loading the first voltage level (a high voltage signal) or switching from the first voltage signal to a second voltage signal that is set to a low voltage level for turning off a corresponding switching transistor. As mentioned above, the pixel electrode charging period corresponds a time duration that the pixel electrode in the sub-pixel area is able to be charged by a voltage signal loaded from the data line associated with the sub-pixel area.

For implementing the method, each sub-pixel area of the array substrate is configured with multiple switching transistors having their gates respectively connected to multiple different gate lines. When all the multiple switching transistors associated with the sub-pixel area are in an ON-state, the pixel electrode in the sub-pixel area can be charged. When any one or more of the multiple switching transistors are in an OFF-state, the pixel electrode in the sub-pixel area will not be charged. Thus, during an operation of driving the array substrate for displaying a frame of image, outside the pixel electrode charging period, it is optional to have any one of the multiple switching transistors within the sub-pixel area to be in an ON-state as long as not all switching transistors are in the ON-state. In other words, it is possible to properly and relatively flexibly adjust a first time period that any switching transistor is in ON-state and a second time period that the same switching transistor is in OFF-state during any time period of displaying a frame of image without affecting the pixel electrode charging of the sub-pixel area. Particularly, as a ratio of the first time period and the second time period of each switching transistor in ON-state and in OFF-state can be set to within an optimum range so that the time of setting the switching transistor under negative bias or under positive bias can be balanced to make the threshold voltage of the switching transistor substantially free of bias-stress-related shifting. This method provides a solution for the problem of image abnormity and enhances image quality of the thin-film-transistor-based display apparatus.

Optionally, the method for driving the array substrate includes loading the first voltage level to the first gate line and the second gate line respectively and concurrently during the pixel electrode charging period to turn on the first switching transistor and the second switching transistor such that both the first switching transistor and the second switching transistor are in an ON-state. The method further includes loading the second voltage level to at least one of the first gate line and the second gate line prior to and subsequent to the pixel electrode charging period to turn the at least one of the first switching transistor and the second switching transistor to an OFF-state. Optionally, it can be controlled to have one of the two switching transistors to be in an ON-state and another one in an OFF-state so that the two switching transistors will not all be in an OFF-state for a long time outside the pixel electrode charging period. Optionally, a ratio of the ON-state time over the OFF-state time for any switching transistor can be controlled between 0.1 and 10. This allows the time of each switching transistor under negative bias or under positive bias to be balanced so that the transistor threshold voltage level is substantially free of bias-related shifting to avoid problems of display image abnormity and enhance display quality.

In some embodiments, the array substrate includes total K gate lines, K being a positive integer. Each sub-pixel area includes two switching transistors respectively coupled to two adjacent gate lines, a k-th gate line and a (k+1)-th gate line, wherein k represents all odd-numbered gate lines in K gate lines, for controlling a connection between a pixel electrode in the each sub-pixel area and a data line. Optionally, in a first time period, the method for driving the array substrate includes loading the first voltage level to the k-th gate line within a k-th time interval and loading the first voltage level to the (k+1)-th gate line within a (k+1)-th time interval. At an end of the k-th time interval, the first voltage level is reset to a second voltage level. In particular, the (k+1)-th time interval starts after the k-th time interval and partially overlaps with the k-th time interval. During the overlapped time, both switching transistors are turned ON to allow the pixel electrode being charged by a data signal from the data line. Outside the overlapped time, the k-th gate line is reloaded the first voltage level starting from another time point after the (k+1)-th gate line is reset to the second voltage level until the first time period ends.

The first time period is a time period for displaying one frame of image by scanning through all K gate lines of the array substrate disclosed in the present disclosure.

Additionally, in a second time period, the method for driving the array substrate further includes the first voltage level to the k-th gate line within an alternate k-th time interval and loading the first voltage level to the (k+1)-th gate line within an alternate (k+l1-th time interval. The alternate (k+1)-th time interval starts after the alternate k-th time period and partially overlaps with the alternate k-th time interval. Outside the overlapped time, the method for driving the array substrate further includes loading the first voltage signal to the (k+1)-th gate line is reloaded the first voltage level starting from another time point after the (k+2)-th gate line is reset to the second voltage level until the second time period ends.

The second time period is a display time period for displaying one frame of image by scanning through all K gate lines of the array substrate disclosed in the present disclosure. The second time period can be separated from the first time period by any N numbers of display time periods, N can be 0 or a positive integer. Optionally, the first time period and the second period are provided alternatively (e.g., alternatively repeated). Optionally, within each of the N>0 numbers of time periods, the first gate scanning signal is provided with the first voltage level for a first duration and subsequently provided with the second voltage level after the first duration and maintained at the second voltage level until the each of the N>0 numbers of time periods ends. The second gate scanning signal is provided with the first voltage level for a second duration and subsequently provided with the second voltage level after the second duration maintained at the second voltage level until the each of the N>0 numbers of time periods ends.

In some embodiments, each sub-pixel area includes two switching transistors respectively coupled to two adjacent gate lines, a j-th gate line and a (j+1)-th gate line, wherein j represents all even-numbered gate lines in K gate lines, for controlling a connection between a pixel electrode in the each sub-pixel area and a data line. Optionally, in a first time period, the method for driving the array substrate includes loading the first voltage level to the j-th gate line within a j-th time interval and loading the first voltage level to the (j+1)-th gate line within a (j+1)-th time interval. At an end of the j-th time interval, the first voltage level is reset to a second voltage level. The (j+1)-th time interval starts after the j-th time interval and partially overlaps with the j-th time interval. During the overlapped time, both switching transistors are turned ON to allow the pixel electrode being charged by a data signal from the data line. Then outside the overlapped time, the (j+1)-th gate line is reloaded the first voltage level starting from another time point after the (j+2)-th gate line is reset to the second voltage level until the first time period ends.

Additionally, in a second time period, the method for driving the array substrate further includes the first voltage level to the j-th gate line within an alternate j-th time interval and loading the first voltage level to the (j+1)-th gate line within an alternate (j+1)-th time interval. The alternate (j+1)-th time interval starts after the alternate j-th time period and partially overlaps with the alternate j-th time interval. Outside the overlapped time, the method for driving the array substrate further includes loading the first voltage signal to the j-th gate line is reloaded the first voltage level starting from another time point after the (j+1)-th gate line is reset to the second voltage level until the second time period ends.

The second time period is a display time period for displaying one frame of image by scanning through all K gate lines of the array substrate disclosed in the present disclosure. The second time period can be separated from the first time period by any N numbers of display time periods, N can be 0 or a positive integer. Optionally, the first time period and the second time period are provided alternatively (e.g., alternatively repeated). Optionally, within each of the N>0 numbers of time periods, the first gate scanning signal is provided with the first voltage level for a first duration and subsequently provided with the second voltage level after the first duration and maintained at the second voltage level until the each of the N>0 numbers of time periods ends. The second gate scanning signal is provided with the first voltage level for a second duration and subsequently provided with the second voltage level after the second duration maintained at the second voltage level until the each of the N>0 numbers of time periods ends.

Figure 3:
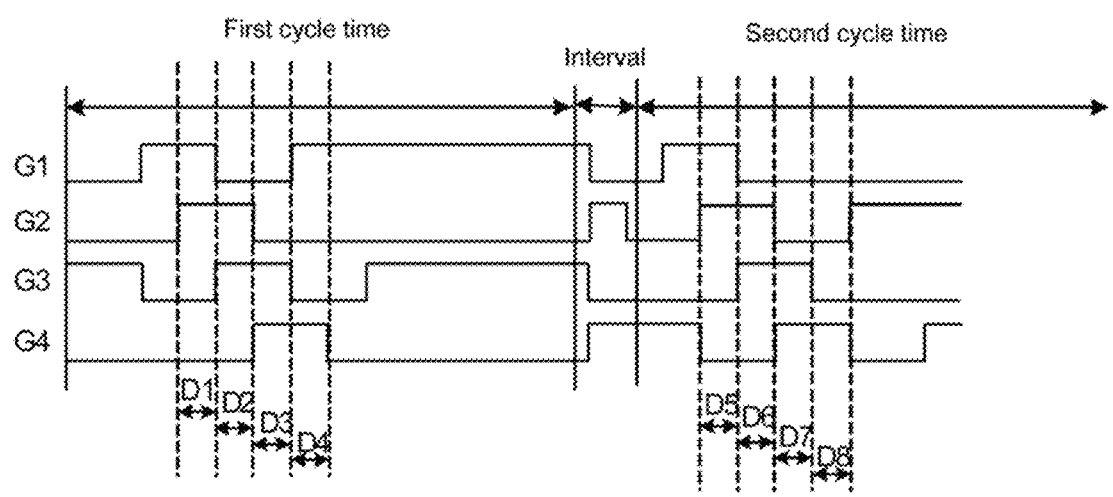
FIG. 3 is a timing waveform of multiple gate driving signals for driving the array substrate according to some embodiments of the present disclosure.

Referring to FIG. 2 and FIG. 3, the array substrate includes total K gate lines, K is an integer. Each sub-pixel area includes a first switching transistor and a second switching transistor respectively coupled to a first gate line and a second gate line. The first gate line is an odd-numbered gate line and the second gate line is a next even-numbered gate line adjacent to the odd-numbered gate line. The method of driving the array substrate includes, in a first time period, loading a first gate scanning signal to each odd-numbered gate line of the K gate lines and a second gate scanning signal to each even-numbered gate line of the K gate lines. The first gate scanning signal is provided with the first voltage level for a first duration and subsequently provided with the second voltage level after the first duration. The second gate scanning signal is provided with the first voltage level for a second duration and subsequently provided with the second voltage level after the second duration maintained at the second voltage level until the first time period ends. The second duration starts after the first duration and partially overlaps with the first duration. The first gate scanning signal loaded to any odd-numbered gate line is provided with the first voltage level again starting from another time point after the second gate scanning signal loaded to a next even-numbered gate line adjacent to the any odd-numbered gate line is provided with the second voltage level until the first time period ends.

In a second time period, the method further includes loading the first gate scanning signal to each odd-numbered gate line of the K gate lines and the second gate scanning signal to each even-numbered gate line of the K gate lines. The first gate scanning signal is provided with the first voltage level for a first duration and subsequently provided with the second voltage level after the first duration and maintained at the second voltage level until the second time period ends. The second gate scanning signal is provided with the first voltage level for a second duration and subsequently provided with the second voltage level after the second duration. The second duration starts after the first duration and partially overlaps with the first duration. The second gate scanning signal loaded to any even-numbered gate line is provided with the first voltage level again starting from another time point after the first gate scanning signal loaded to a next odd-numbered gate line adjacent to the any even-numbered gate line is provided with the second voltage level until the second time period ends.

FIG. 3 is a timing waveform of multiple gate scanning signals for driving the array substrate according to some embodiments of the present disclosure. Referring to FIG. 3, it shows several gate scanning signals loaded respectively (or scanned in partial sequential order) to the first gate line G1, the second gate line G2, the third gate line G3, the fourth gate line G4. G1 and G2 are used for driving the first sub-pixel area to charge its pixel electrode by a corresponding data line. G2 and G3 are used for driving the second sub-pixel area to charge its pixel electrode by the corresponding data line. G3 and G4 are used for driving the third sub-pixel area to charge its pixel electrode.

Referring to FIG. 3, in a first cycle time, the gate driving signal is loaded or scanned to corresponding gate line one by one to turn on corresponding switching transistor in a partial sequential order. In particular, a duration of loading the first voltage level to G1 is overlapped in a first overlapping time D1 with a duration of loading the first voltage level to next gate line G2. In the first overlapping time D1, the pixel electrode of the first sub-pixel area can be charged for displaying image. After D1, G1 is reset to a second voltage level (a low voltage signal), the charging of pixel electrode of the first sub-pixel area is halted. Now a duration of loading the first voltage level to G2 is overlapped in a second overlapping time D2 with a duration of loading the first voltage level to a next gate line G3. In the second overlapping time D2, the pixel electrode of the second sub-pixel area can be charged for displaying image. After D2, G2 is reset to the second voltage level and G1 is loaded with the first voltage level again. The pixel electrode of the second sub-pixel area is no longer charged and the first switching transistor associated with the first sub-pixel area is now set to a positive bias state. After the second overlapping time D2, a duration of loading the first voltage level to G3 is overlapped in a third overlapping time D3 with a duration of loading the first voltage level to next gate line G4. In the third overlapping time D3, the pixel electrode of the third sub-pixel area can be charged for displaying image. After D3, G3 is reset to the second voltage level and the pixel electrode associated with the third sub-pixel area is no longer charged. After D3, a duration of loading the first voltage level to G4 is overlapped in a fourth overlapping time D4 with a duration of loading the first voltage signal to next gate line to allow the pixel electrode of the fourth sub-pixel area to be charged for displaying image. After the fourth overlapping time D4, G4 is reset to the second voltage level and the pixel electrode of the fourth sub-pixel area is no longer charged. At the same time, G3 is loaded with the first voltage signal again to make the first switching transistor of the third sub-pixel area in a positive bias state. The above sequences can be continued for additional number of gate lines and sub-pixel areas in the same manner. Under a condition that the overall display is not affected, the gate lines at odd-numbered rows are loaded with the first voltage signal to make the first switching transistor of the sub-pixel areas in odd-numbered rows and the second switching transistor of the sub-pixel areas in even-numbered rows in positive bias state; and the gate lines at even-numbered rows are loaded with the second voltage signal to make the first switching transistor of the sub-pixel areas in even-numbered rows and the second switching transistor of the sub-pixel areas in odd-numbered rows in negative bias state.

After an interval and entering the second time period, referring to FIG. 3, those gate lines mentioned above are loaded with a gate scanning signal one by one to turn on respective switching transistors. In particular, a duration of loading the first voltage level to G1 is overlapped in a first overlapping time D1 with a duration of loading the first voltage level to next gate line G2. In the first overlapping time D5, the pixel electrode of the first sub-pixel area can be charged for displaying image. After the first overlapping time D5, G1 is reset with a second voltage level, a low voltage signal, to turn off the corresponding switching transistor so that the pixel electrode of the first sub-pixel area is no longer charged. Now, a duration of loading the first voltage signal to G2 is overlapped in a second overlapping time D6 with a duration of loading the first voltage level to next gate line G3. In the second overlapping time D6, the pixel electrode of the second sub-pixel area can be charged for displaying image. After D6, G2 is reset to the second voltage level. A duration of loading the first voltage level to G3 is overlapped in a third overlapping time D7 with a duration of loading the first voltage level to next gate line G4. In the third overlapping time D7, the pixel electrode of the third sub-pixel area can be charged for displaying image. After D7, G3 is reset to the second voltage level and the pixel electrode of the third sub-pixel area is no longer charged. After D7, a duration of loading the first voltage level to G4 is overlapped in a fourth overlapping time D8 with a duration of loading the first voltage level to next gate line. In the fourth overlapping time D8, the pixel electrode of the fourth sub-pixel area can be charged for displaying image. After the fourth overlapping time D8, 04 is set to the second voltage level and the pixel electrode of the fourth sub-pixel area is no longer charged. At the same time, G2 is set to the second voltage level so that the first switching transistor of the second sub-pixel area is set to a positive bias state. The above sequence of operations can be continued for additional number of gate lines in different rows of the array substrate. Under a condition that the overall display is not affected, the gate lines at odd-numbered rows are reset to the second voltage level to make the first switching transistor of the sub-pixel areas in odd-numbered rows and the second switching transistor of the sub-pixel areas in even-numbered rows in negative bias state; and the gate lines at even-numbered rows are loaded with the first voltage level to make the first switching transistor of the sub-pixel areas in even-numbered rows and the second switching transistor of the sub-pixel areas in odd-numbered rows in positive bias state.

Each of the first time period and the second time period is a display time period for displaying one frame of image by scanning through all gate lines of the array substrate disclosed in the present disclosure. The interval that separates the second time period from the first time period can be any N numbers of display time periods, where N can be 0 or a positive integer. Optionally, the first time period and the second time period are provided alternatively (e.g., alternatively repeated).

In yet another aspect, the present disclosure provides a driving circuit for driving an array substrate provided in the present disclosure. In particular, the driving circuit includes a gate driving circuit configured to load a first voltage level to each of the multiple different gate lines respectively connected to respective gate electrodes of the multiple switching transistors in the each sub-pixel area to turn on each of the multiple switching transistors independently. Each of the multiple switching transistors is in an ON-state during the pixel electrode charging period for inputting a data signal to the pixel electrode. The gate driving circuit is further configured to load a second voltage level to at least one of the multiple different gate lines to turn at least one of the multiple switching transistors in the each sub-pixel area to an OFF-state prior to and subsequent to the pixel electrode charging period.

For applying the driving circuit to drive the array substrate provided in the present disclosure, each sub-pixel area of the array substrate is configured with multiple switching transistors having their gates respectively connected to multiple different gate lines for forming a connection between a pixel electrode and a data line. Only when all the multiple switching transistors associated with the sub-pixel area are in an ON-state, the sub-pixel area can be charged. When any one or more of the multiple thin-film transistors are in an OFF-state, the pixel electrode in the sub-pixel area cannot be charged. Thus, during an operation of driving the array substrate and outside the pixel electrode charging period, it is optional to have any one of the multiple switching transistors within the sub-pixel area to be in an ON-state as long as not all switching transistors are in an ON-state. In other words, it is possible to properly and relatively flexibly adjust a first time period that any switching transistor is in an ON-state and a second time period that the same switching transistor is in an OFF-state during any display time period for displaying a frame of image without affecting the charging of each pixel electrode in each sub-pixel area for image display. Particularly, a ratio of the first time period and the second time period of each switching transistor in ON-state and in OFF-state can be set to within an optimum range. Thus, the time of the switching transistor being under negative bias or under positive bias can be properly balanced to make the threshold voltage of the switching transistor substantially free of bias-related shifting. This driving circuit provides a solution for the problem of image display abnormity and enhances image quality of the thin-film-transistor-based display apparatus.

In still another aspect, the present disclosure provides a display apparatus including the array substrate provided in the present disclosure and including the driving circuit provided in the present disclosure. The display apparatus includes but not limited to liquid crystal TV, liquid crystal displayer, digital frame, mobile phone, tablet computer, etc. The display apparatus also includes flexible circuit board, printing circuit board, and backplane.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method for driving an array substrate comprising a plurality of gate lines and a plurality of data lines crossing over each other thereby defining an array of a plurality of sub-pixel areas, a respective sub-pixel area comprising a pixel electrode and multiple switching transistors having respective gate electrodes coupled to multiple different gate lines, wherein the pixel electrode is configured to be charged by a data signal from a respective data line only with all the multiple switching transistors being turned on concurrently during a pixel electrode charging period by an effective voltage level applied respectively on the multiple different gate lines;

wherein the array substrate comprises a first gate line and a second gate line being two adjacent gate lines among the plurality of gate lines and comprises a first switching transistor and a second switching transistor coupled in series in the respective sub-pixel area, the first gate line being connected to a gate of the first switching transistor and the second gate line being connected to a gate of the second switching transistor;

the array substrate comprises a total of K gate lines, K is an integer, the first gate line is an odd-numbered gate line and the second gate line is a next even-numbered gate line adjacent to the odd-numbered gate line, the method comprising:

loading a first voltage level equal to or above to the effective voltage level to a respective one of the multiple different gate lines respectively connected to respective gate electrodes of the multiple switching transistors in the respective sub-pixel area to turn on a respective of the multiple switching transistors independently, wherein the respective of the multiple switching transistors is in an ON-state during the pixel electrode charging period for inputting a data signal to the pixel electrode; and loading a second voltage level to at least one of the multiple different gate lines to turn at least one of the multiple switching transistors in the respective sub-pixel area to an OFF-state prior to and subsequent to the pixel electrode charging period;

loading the first voltage level to the first gate line and the second gate line respectively and concurrently during the pixel electrode charging period to turn on the first switching transistor and the second switching transistor such that both the first switching transistor and the second switching transistor are in an ON-state; and loading the second voltage level to at least one of the first gate line and the second gate line prior to and subsequent to the pixel electrode charging period to turn the at least one of the first switching transistor and the second switching transistor to an OFF-state;

in a first time period, loading a first gate scanning signal to each odd-numbered gate line of the K gate lines and a second gate scanning signal to each even-numbered gate line of the K gate lines, the first gate scanning signal being provided with the first voltage level for a first duration and subsequently provided with the second voltage level after the first duration, the second gate scanning signal being provided with the first voltage level for a second duration and subsequently provided with the second voltage level after the second duration maintained at the second voltage level until the first time period ends, wherein the second duration starts after the first duration and partially overlaps with the first duration; wherein the first gate scanning signal loaded to any odd-numbered gate line is provided with the first voltage level again starting from another time point after the second gate scanning signal loaded to a next even-numbered gate line adjacent to the any odd-numbered gate line is provided with the second voltage level until the first time period ends; and in a second time period, loading the first gate scanning signal to each odd-numbered gate line of the K gate lines and the second gate scanning signal to each even-numbered gate line of the K gate lines, the first gate scanning signal being provided with the first voltage level for a first duration and subsequently provided with the second voltage level after the first duration and maintained at the second voltage level until the second time period ends, the second gate scanning signal being provided with the first voltage level for a second duration and subsequently provided with the second voltage level after the second duration, wherein the second duration starts after the first duration and partially overlaps with the first duration; wherein the second gate scanning signal loaded to any even-numbered gate line is provided with the first voltage level again starting from another time point after the first gate scanning signal loaded to a next odd-numbered gate line adjacent to the any even-numbered gate line is provided with the second voltage level until the second time period ends.

2. The method of claim 1, wherein the first switching transistor includes a source electrode connected to the respective data line and a drain electrode connected to a source electrode of the second switching transistor, the second switching transistor includes a drain electrode connected to the pixel electrode.

3. The method of claim 1, wherein either one of the first gate line and the second gate line is a gate line commonly connected to two respective gates of two switching transistors respectively in two sub-pixel areas adjacent to each other along a same data line.

4. The method of claim 1, wherein a ratio of a first time interval in ON-state over a second time interval in OFF-state for each of the first switching transistor and the second switching transistor is set to be between proximately 0.1 and proximately 10.

5. The method of claim 1, wherein the first time period is a time period of displaying a frame of image through the K gate lines of the array substrate, the second time period is another time period of displaying a frame of image through the K gate lines of the same array substrate, the second time period is separated from the first time period by an time interval equal to N numbers of time periods of displaying a frame of image, wherein N equal to 0 or a positive integer.

6. The method of claim 5, wherein the first time period and the second time period are provided alternatively.

7. The method of claim 5, wherein, within each of the N>0 numbers of time periods, the first gate scanning signal is provided with the first voltage level for a first duration and subsequently provided with the second voltage level after the first duration and maintained at the second voltage level until the each of the N>0 numbers of time periods ends, the second gate scanning signal is provided with the first voltage level for a second duration and subsequently provided with the second voltage level after the second duration maintained at the second voltage level until the each of the N>0 numbers of time periods ends.

* * * * *